US008754818B2

(12) United States Patent
Yen et al.

(10) Patent No.: US 8,754,818 B2
(45) Date of Patent: Jun. 17, 2014

(54) INTEGRATED ANTENNA STRUCTURE ON SEPARATE SEMICONDUCTOR DIE

(75) Inventors: Hsiao-Tsung Yen, Tainan (TW); Yu-Ling Lin, Taipei (TW); Chin-Wei Kuo, Zhubei (TW); Ho-Hsiang Chen, Hsinchu (TW); Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 70 days.

(21) Appl. No.: 13/541,937

(22) Filed: Jul. 5, 2012

(65) Prior Publication Data
US 2014/0008773 A1    Jan. 9, 2014

(51) Int. Cl.
  *H01Q 1/12* (2006.01)
  *H01Q 1/38* (2006.01)
  *H01Q 1/40* (2006.01)

(52) U.S. Cl.
  CPC ... *H01Q 1/38* (2013.01); *H01Q 1/40* (2013.01)
  USPC ........................................................ 343/702

(58) Field of Classification Search
  CPC ............. H01Q 1/38; H01Q 1/40; H01Q 1/44; H01Q 21/065
  USPC ........................................ 343/702, 715, 770
  See application file for complete search history.

(56) References Cited

U.S. PATENT DOCUMENTS

| 2010/0193935 | A1  | 8/2010 | Lachner et al. |
| 2012/0068896 | A1* | 3/2012 | White et al. .................. 343/713 |
| 2012/0153433 | A1* | 6/2012 | Yen et al. ...................... 257/531 |

OTHER PUBLICATIONS

U.S. Appl. No. 13/778,528, filed Feb. 27, 2013.
"What, Why and How of Through-Silicon Vias" Mentor Graphics Corp., SOCcentral, Jun. 5, 2012, p. 1-4.
D. Orban, et al., "The Basics of Patch Antennas", Orban Microwave Products, www.orbanmicrowaveproducts.com, Jul. 5, 2012, p. 1-9.

* cited by examiner

*Primary Examiner* — Thomas L Dickey
(74) *Attorney, Agent, or Firm* — Eschweiler & Associates, LLC (57) ABSTRACT

Some embodiments relate to a semiconductor module comprising an integrated antenna structure configured to wirelessly transmit signals. The integrated antenna structure has a lower metal layer and an upper metal layer. The lower metal layer is disposed on a lower die and is connected to a ground terminal. The upper metal layer is disposed on an upper die and is connected to a signal generator configured to generate a signal to be wirelessly transmitted. The upper die is stacked on the lower die and is connected to the lower die by way of an adhesion layer having one or more micro-bumps. By connecting the lower and upper die together by way of the adhesion layer, the lower and upper metal layers are separated from each other by a large spacing that provides for a good performance of the integrated antenna structure.

20 Claims, 7 Drawing Sheets

INTEGRATED ANTENNA STRUCTURE ON SEPARATE SEMICONDUCTOR DIE

BACKGROUND

Many modern day electronic devices use integrated antennas (e.g., microstrip antennas) to communicate wirelessly with other electronic devices. Integrated antennas used in high frequency wireless communication devices (e.g., devices operating in the millimeter region of the electromagnetic spectrum) often use planar antennas disposed on a high frequency substrate or high frequency printed circuit board (HF PCBs). The planar antennas are connected to an integrated chip (CMOS chip) by way of one or more interconnects comprising bond-wires or flip-chip C4 solder balls.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Figure 1:
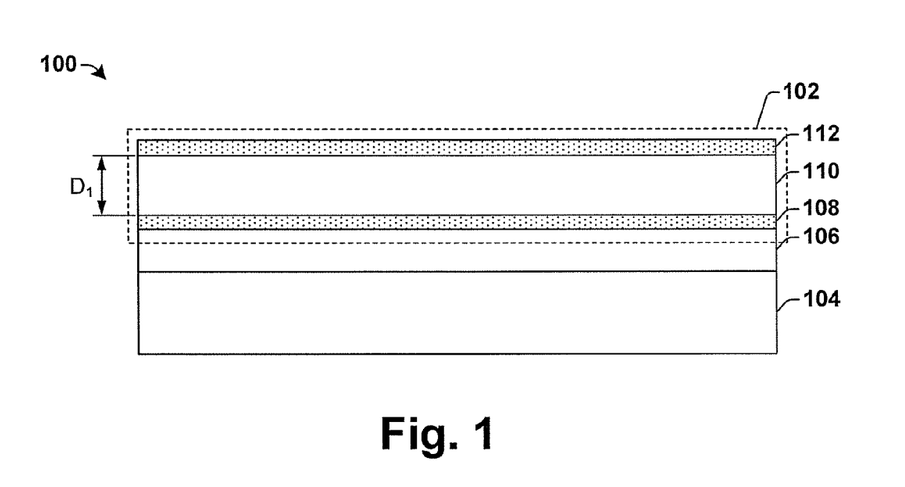
FIG. 1 is a cross-sectional view of semiconductor module with a conventional planar antenna.

FIG. 1 illustrates a semiconductor module 100 with a conventional integrated antenna structure 102. The integrated antenna structure 102 is located on a semiconductor body 104, and comprises a lower metal layer 108, and an upper metal layer 112 disposed above the lower metal layer 108. The lower metal layer 108 is configured above a plurality of metal interconnect layers (not shown) disposed within one or more dielectric layers 106 and is separated from the upper metal layer 112 by an additional dielectric layer 110. The additional dielectric layer 110 (e.g., $SiO_2$) typically has a thickness that is approximately 1-3 microns thick, thereby separating the lower and upper metal layers, 108 and 112, by a distance $D_1$ that is typically between approximately 1-3 microns.

The lower and upper metal layers, 108 and 112, are configured to be biased in a manner that forms an electrical field therebetween, which radiates as a wireless signal from the integrated antenna structure 102. However, the impedance bandwidth of such an integrated antenna structure 102 is dependent upon the distance $D_1$ between the lower and upper metal layers, 108 and 112. For example, as the upper metal layer 112 is moved closer to the lower metal layer 108, the integrated antenna structure 102 radiates less energy and more energy is stored in the capacitance and inductance of the upper metal layer 112. Therefore, it has been appreciated that the performance of an integrated antenna structure can be improved by increasing the distance between metal layers of the integrated antenna structure.

Accordingly, the present disclosure relates to a semiconductor module comprising an integrated antenna structure having upper and lower metal layers separated by a relatively large space that provides for good performance. In some embodiments, a disclosed integrated antenna structure configured to wirelessly transmit signals has a lower metal layer and an upper metal layer. The lower metal layer is disposed on a lower die and is connected to a ground terminal. The upper metal layer is disposed on an upper die and is connected to a signal generator configured to generate a signal to be wirelessly transmitted. The upper die is stacked on the lower die and is connected to the lower die by way of an adhesion layer comprising one or more micro-bumps. By connecting the lower and upper die together by way of the adhesion layer, the lower and upper metal layers are separated from each other by a large spacing that provides for a good performance of the integrated antenna structure.

Figure 2:
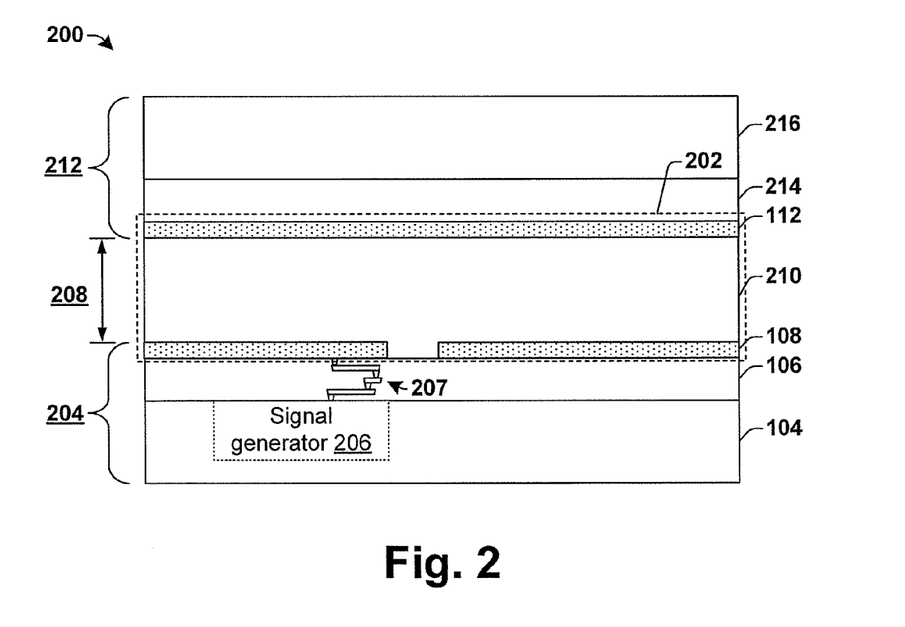
FIG. 2 illustrates a cross-sectional view of some embodiments of a semiconductor module with a disclosed integrated antenna structure.

FIG. 2 illustrates a cross-sectional view of some embodiments of a semiconductor module 200 with a disclosed integrated antenna structure 202. The integrated antenna structure 202 comprises a lower metal layer 108 and an upper metal layer 112, which is positioned above the lower metal layer 108.

The lower metal layer 108 is disposed on a lower die 204. In some embodiments, the lower metal layer 108 comprises aluminum or copper. In various embodiments, the lower die 204 comprises an integrated chip die or a package substrate (e.g., a BT substrate comprising a logic chip comprising a MMIC chip). In some embodiments, the lower die 204 comprises an integrated chip die having one or more semiconductor devices. The semiconductor devices are located within a semiconductor body 104 and connected to the lower metal layer 108 by way of one or more metal interconnect layers 207 disposed within one or more lower dielectric layers 106 located on the lower die 204.

In some embodiments, the semiconductor devices comprised within the semiconductor body 104 form a signal generator 206 configured to generate a signal for transmission. For example, in some embodiments, the one or more semiconductor devices comprise a signal generator 206 comprising a monolithic microwave integrated circuit (MMIC) chip configured to generate a signal that is provided to the upper metal layer 112 (e.g., by way of one or more micro-bumps). In various embodiments, the MMIC chip may comprise a mixer configured to perform microwave mixing, one or more filters configured to perform filtering of the mixed signal, a power amplifier configured to perform power amplification, etc. In some other embodiments, the signal generator 206 is positioned on a different die (e.g., an upper die 212 or a separate integrated chip die connected to the lower die 204). In some embodiments, the signal generator 206 is a transceiver, transmitter, or a receiver.

The upper metal layer 112 is disposed on an upper die 212 stacked vertically above the lower die 204. In some embodiments, the upper die 212 comprises an interposer substrate 216 (e.g., a glass or silicon interposer substrate) having one or more upper dielectric layers 214. In some embodiments, the interposer substrate 216 comprises a conventional interposer substrate. In other embodiments, the interposer substrate 216 comprises a high resistance interposer substrate (e.g., having a resistance in a range of approximately 10 ohm-cm to approximately 1000 ohm-cm). The high resistance interposer substrate is configured to improve radiation of wireless signals that resonate between the lower and upper metal layers, 108 and 112.

The lower die 204 and the upper die 212 are physically connected together by an adhesion layer 210. The adhesion layer 210 separates the lower die 204 and the upper die by a space $S_1$. In some embodiments, the adhesion layer 210 comprises an underfill layer configured to prevent thermal mismatch between the lower and upper die, 204 and 212. In various embodiments, the underfill layer comprises a moldable underfill comprising a resin or epoxy, for example. In some embodiments, the underfill layer comprises a dielectric constant ($\in_r$) having a value of approximately four (4) or less at room temperature. Such values of dielectric constant improve the gain of the integrated antenna structure 202 (e.g., by approximately 10% to 50%).

In other embodiments, the lower die 204 and the upper die 212 are physically connected to one another by way of an adhesion layer 210 comprising one or more micro-bumps. Compared to flip-chip C4 solder balls, the plurality of micro-bumps provide a smaller bump size (e.g., 10 um-70 um) and a tighter pitch (e.g., 10 um-80 um). In some embodiments, the adhesion layer comprises a plurality of micro-bumps comprised within an underfill layer.

In some embodiments, the adhesion layer 210 comprises one or more micro-bumps located vertically between a routing line located within the lower die 204 and the upper metal layer 112. In such embodiments, the one or more micro-bumps are configured to provide an electrical connection between the routing line of the lower metal layer 108 and the upper metal layer 112, thereby decreasing an interconnect distance between an integrated chip die comprising the signal generator 206 and the integrated antenna structure 202. Since an interconnect has an inductance that is proportional to its length, shortening the interconnect distance decreases the inductance of the interconnect and therefore further improves performance of the integrated antenna structure 202.

In some embodiments, at least a part of the lower metal layer 108 is configured to operate as a grounded element (i.e., a ground plane) and the upper metal layer 112 is configured to operate as an excited element. For example, the upper metal layer 112 is configured to receive a signal from the signal generator 206 that causes the upper metal layer 112 to act as a radiating element, and that causes an electric field to be formed between the radiating upper metal layer 112 and the grounded lower metal layer 108. The electric field resonates between the lower and upper metal layers, 108 and 112, at a fundamental mode of the integrated antenna structure 202 according to a radiation pattern that is a function of a combination of lower and upper metal layers, 108 and 112. The radiating signals form standing waves between the lower and upper metal layers, 108 and 112, which "leak" out the ends of the integrated antenna structure 202.

By separating the lower die 204 from the upper die 212 by an adhesion layer 210, a space $S_1$ between the lower and upper metal layers, 108 and 112, is increased over that of conventional integrated antenna structures (e.g., the conventional integrated antenna structure 102). For example, an adhesion layer 210 comprising micro-bumps typically provides for a space $S_1$ between the lower metal layer 108 and the upper metal layer 112 that is equal to approximately 20-40 microns. The large space $S_1$ between the lower and upper metal layers, 108 and 112, improves performance of the integrated antenna structure 202.

One of ordinary skill in the art will appreciate that operation of the disclosed integrated antenna structure is dependent on its dimensions. The dimensions of components within the disclosed integrated antenna structure will depend on a number of parameters, including the frequency of operation and the type of antenna. For example, in a disclosed integrated chip structure comprising a patch antenna, a length of the upper metal layer is approximately equal to a one half of a wavelength of a transmitted signal and a width of the upper metal layer can be chosen to provide a desired input impedance. (e.g., 50 ohms). In some embodiments, the dimensions of the disclosed integrated antenna structure (e.g., the lower and upper metal layers) are obtained by the use of simulation tools that provide a radiation pattern of an integrated antenna structure.

Figure 3:
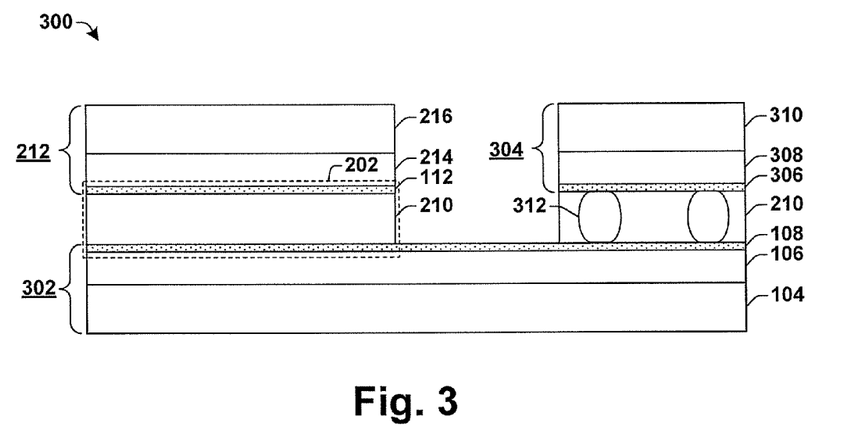
FIG. 3 illustrates a cross-sectional view of some embodiments of a 2.5D semiconductor module with a disclosed integrated antenna structure.

FIG. 3 illustrates a cross-sectional view of some embodiments of a 2.5D semiconductor module 300 with a disclosed integrated antenna structure 202.

The 2.5D semiconductor module 300 comprises a lower die comprising a base die 302 having a lower metal layer 108. In some embodiments, the lower metal layer 108 is located on a top surface of the base die 302, while in other embodiments the lower metal layer 108 is located within one or more lower dielectric layers 106 disposed on the base die 302 and having an opening that allows the lower metal layer 108 to be contacted from above.

A plurality of additional die are connected to a same side of the base die 302 by way of an adhesion layer 210. In some embodiments, each of the plurality of additional die comprise a separate system, thereby allowing for the 2.5D semiconductor module 300 to comprise an integrated antenna structure 202 as well as other functional die. For example, in some embodiments, the additional die comprise a second, upper die 212 and a third die 304.

The second, upper die 212 comprises an antenna die containing an upper metal layer 112 that along with the lower metal layer 108 forms the integrated antenna structure 202. In some embodiments, the upper metal layer 112 is located on a bottom surface of the second, upper die 212, while in other embodiments the upper metal layer 112 is located within one or more upper dielectric layers 214 disposed on the second, upper die 212. In some embodiments, the dielectric layers 214 have an opening that allows the upper metal layer 112 to be contacted from below.

The third die 304 comprises a logic die configured to implement one or more logic functions. In some embodiments, the third die 304 comprises a signal generator (e.g., a MMIC circuit) configured to provide signals to be transmitted to the upper metal layer 112 of the integrated antenna structure 202. In other embodiments, the third die 304 comprises a signal processor configured to operate on signals received by the disclosed integrated antenna structure 202.

It will be appreciated that the 2.5D semiconductor module 300 may comprise additional die besides those shown, which are stacked on the base die 302. The additional stacked die may comprise functional die configured to perform specific functions, such as a cache die, a logic die, a die for analog devices, etc. By stacking a plurality of die onto the base die 302, different process nodes (e.g., 45 nm, 32 nm, 22 nm, etc.) and/or manufacturing types (e.g., SiGe, SOI, CMOS Low voltage, CMOS High voltage, BiPolar, GaAs, etc.) can be used within the 2.5D semiconductor module 300.

Figure 4:
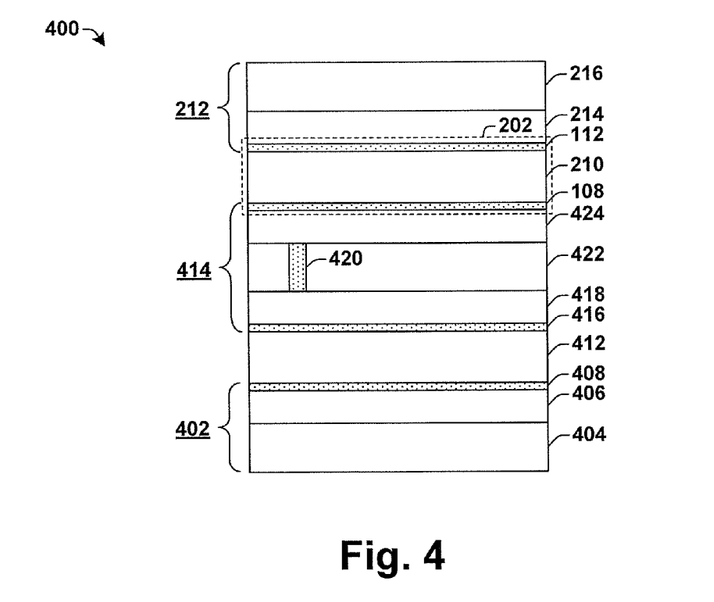
FIG. 4 illustrates a cross-sectional view of some embodiments of a 3D semiconductor module with a disclosed integrated antenna structure.

FIG. 4 illustrates a cross-sectional view of some embodiments of a 3D semiconductor module 400 with a disclosed integrated antenna structure 202.

The 3D semiconductor module 400 comprises a first die 402. In some embodiments, the first die 402 comprises a semiconductor substrate 404 having a first metal layer 408 disposed over one or more dielectric layers 406. In some embodiments, the first die 402 comprises an integrated chip die comprising a signal generator (e.g., a MMIC circuit).

A lower die 414 is stacked on the first die 402. The lower die 414 comprises an interposer substrate 422 having a second metal layer 416 on one side and having a lower metal layer 108 on an opposite side. The second metal layer 416 and the lower metal layer 108 are connected to one another by way of one or more through-silicon-vias (TSVs) 420. The one or more TSVs 420 comprise a conductive material that extends through the interposer substrate 422, as well as a plurality of dielectric layers 418 and 424, and that provides an electrical connection between the second metal layer 416 and the lower metal layer 108. In various embodiments, the conductive material may comprise copper, tungsten, or aluminum. In some embodiments, the dielectric layers, 418 and 424, comprise one or more metal routing layers configured to connect the TSVs 420 to micro-bumps.

An upper die 212 is stacked on the lower die 414. The upper die comprises an antenna die containing an upper metal layer 112. An integrated antenna structure is formed from two metal layers of the 3D semiconductor module 400. In some embodiments, the upper metal layer 112 and the lower metal layer 108 cumulatively form an integrated antenna structure 202, as illustrated and as described above. In other embodiments, the integrated antenna structure comprises other combinations of metal layers within the 3D semiconductor module 400. For example, in various embodiments, the integrated antenna structure 200 may comprise the first metal layer 408 and the lower metal layer 108, the first metal layer 408 and the upper metal layer 112, the second metal layer 416 and the lower metal layer 108, the second metal layer 416 and the upper metal layer 112, or the first metal layer 408 and the second metal layer 416.

The first die 402 is structurally connected to the lower die 414 by a first adhesion layer 412. Similarly, the lower die 414 is structurally connected to the upper die 212 by way of a second adhesion layer 210. In some embodiments, the first and second adhesion layers, 412 and 210, comprise micro-bumps configured to provide an electrical connection between metal layers within the die (402, 414 and/or 212) and/or underfill layers configured to prevent thermal mismatch between the die (402, 414 and/or 212).

In some embodiments, the upper die (e.g., 212) comprises a conventional substrate having a resistance of between approximately 0.5 ohms-cm and approximately 100 ohm-cm. In other embodiments, the upper die (e.g., 212) comprises a high resistance interposer substrate configured to operate as a lossy metal layer. By operating as a lossy metal layer, the upper die can operate as a guiding structure that guides the signal generated by the lower and upper metal layers. The guiding structure improves the gain of the disclosed integrated antenna structure, thereby improving the performance of the disclosed integrated antenna structure.

In various embodiments, the high resistance interposer substrate comprises a variety of different substrates. For example, in some embodiments, the high resistance interposer substrate comprises a glass interposer. In other embodiments, the high resistance interposer substrate comprises a silicon wafer having a low doping concentration (e.g., a doping concentration that is less than $10^{13}$ atoms/cm$^{-3}$). In yet other embodiments, the high resistance interposer substrate comprises a conventional substrate having an epitaxial layer that increase the resistance of the substrate (e.g., to a range of approximately 8 ohm-cm to approximately 12 ohm-cm).

Figure 5:
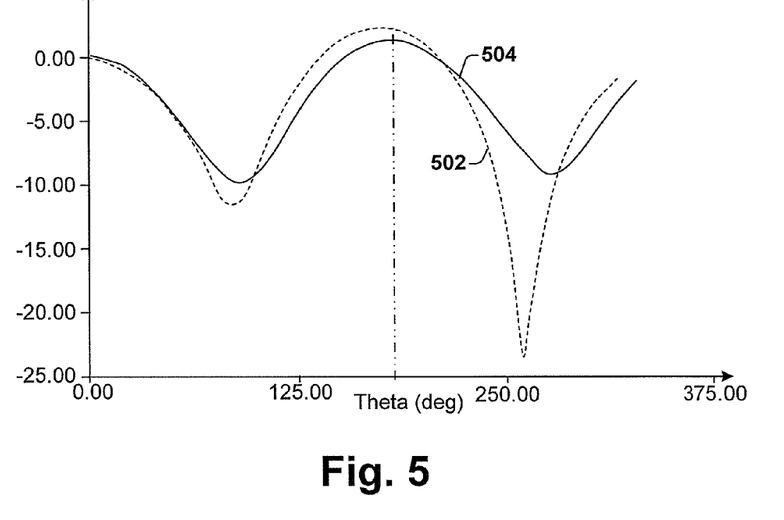
FIG. 5 illustrates a graph showing a gain of an antenna comprising an interposer substrate of varying resistance compared to a conventional silicon substrate.

FIG. 5 illustrate a graph 500 showing a gain of a disclosed integrated antenna structure having a high resistance interposer substrate compared to a gain of a disclosed integrated antenna structure having a conventional interposer substrate. The gain is a measure of the energy that is input into the integrated antenna structure compared to the energy that is radiated from the integrated antenna structure (e.g., a positive gain means that more energy is radiated from the integrated antenna structure than is put into the integrated antenna structure). The graph 500 illustrates the gain on the y-axis and a position of the radiation pattern on the x-axis.

Trend line 502 illustrates the gain of an integrated antenna structure comprising a high resistance interposer substrate having a resistance of approximately 20 ohm-cm. Trend line 504 illustrates the gain of an integrated antenna structure comprising a conventional interposer substrate. Comparison of trend lines 502 and 504 illustrates that the high resistance interposer substrate (trend line 502) increases the gain of the disclosed integrated antenna structure in comparison to a conventional interposer substrate (trend line 504). For example, at 180° the gain of an integrated antenna structure having a high resistance interposer substrate (trend line 502) is between 1 dB and 2 dB. In comparison, an integrated antenna structure comprising a conventional interposer substrate has a gain that is approximately 0 dB.

Figure 6A:
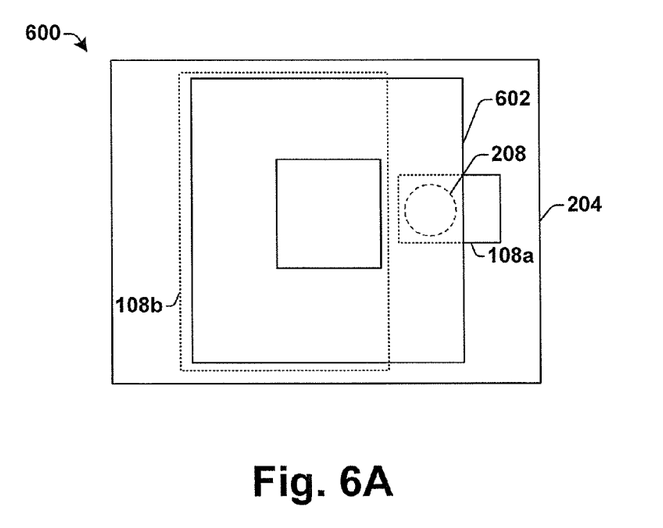
FIG. 6A illustrates a top view of some embodiments of a semiconductor module with a disclosed integrated loop antenna.

FIG. 6A illustrates a top view of some embodiments of a semiconductor module 600 with a disclosed integrated antenna structure. The semiconductor module 600 comprises an upper metal layer 602 comprised within an upper die (e.g., corresponding to 202) and having a loop shape that corresponds to a loop antenna. The upper metal layer 602 is positioned above lower metal layers comprising a first lower metal layer 108a and a second lower metal layer 108b, which is different than the first lower metal layer 108a. The first lower metal layer comprises a routing line 108a, connected to the upper metal layer 602 at a feed point comprising one or more micro-bumps 603. The second lower metal layer comprises a ground plane 108b positioned below the upper metal layer 602 and connected to a ground terminal. In various embodiments, the size of the ground plane 108b will vary from that shown in FIG. 6A. For example, in some embodiments the ground plane has a size large enough to encompass the upper metal layer 602.

It will be appreciated that the semiconductor module 600 is a non-limiting embodiment of a disclosed integrated antenna structure. In other embodiments, the position and size of components of a disclosed integrated antenna structure will vary. For example, in some embodiments, the ground plane 108b is located within a seal ring surrounding the semiconductor module 600. The seal ring is grounded structure comprising a plurality of metal layers and vias that is located around the perimeter of an integrated chip die.

Furthermore, although semiconductor module 600 comprises a loop antenna, it will be appreciated that the disclosed integrated antenna structure(s) can comprise any one of various types of planar antennas. In various embodiments, the disclosed integrated antenna structure comprises a loop antenna, a patch antenna, a dipole antenna, or an array of such antennas. For example in some embodiments, the disclosed integrated antenna structure comprises a Yagi antenna (i.e., a dipole antenna). In such an embodiment, the lower metal layer comprises a passive reflector, the upper metal layer comprises a driven element connected to a feed line comprising a micro-bump, and an interposer substrate acts as a parasitic element (i.e., a director). In some embodiments, the Yagi antenna comprises an interposer substrate (that acts as a director) that is a high resistance interposer that modifies the radiation pattern of the wireless signal emitted by the driven element, directing the wireless signal in a direction perpendicular to the interposer and increasing the gain of the integrated antenna structure. In other embodiments, the Yagi antenna comprises an interposer substrate (that acts as a director) that is a conventional substrate.

The use of one or more micro-bumps to as a feed point(s) that provides signals from the first lower metal level to the upper metal level allows for the feed point(s) to be moved to any location within the upper metal layer 602. It has been appreciated that the location of the feed point(s) can be chosen to affect the radiation pattern generated by the disclosed integrated antenna. By varying the feed point and the type of antenna different radiation patterns can be generated, as shown in FIGS. 6B-6C.

Figure 6B:
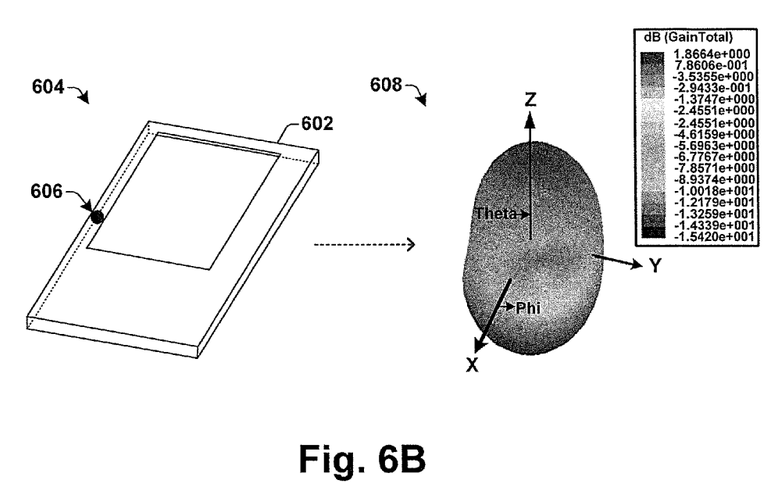
FIGS. 6B-6C illustrate 3D graphs showing the gain of the disclosed loop antenna in various situations.
Figure 6C:
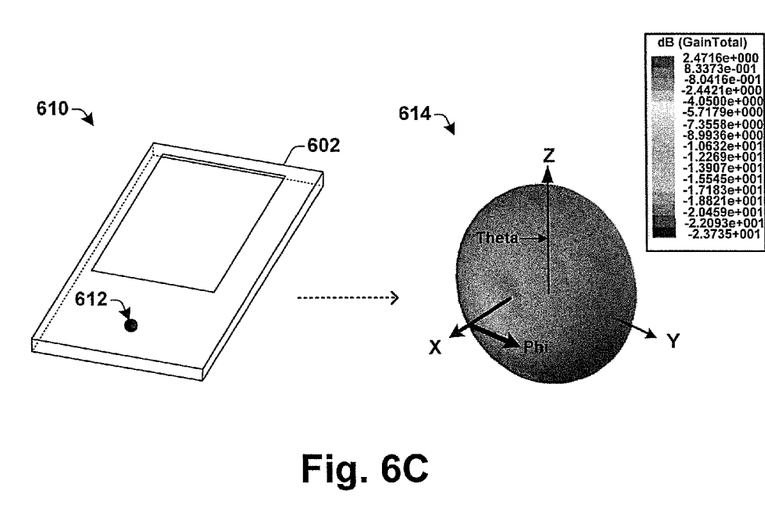

FIG. 6B illustrates an integrated loop antenna 604 comprising a feed point 606 at a first location. The feed point provides a signal to the integrated loop antenna 604 that results in a first radiation pattern 608. The first radiation pattern 608 has a highest gain along the positive and negative z-axes. FIG. 6C illustrates an integrated loop antenna 610 comprising a feed point 612 at a second location that is different than the first location. The feed point provides a signal to the integrated loop antenna 610 that results in a second radiation pattern 614. The second radiation pattern 614 has a highest gain along a plane extending through the y and z-axes.

Figure 7:
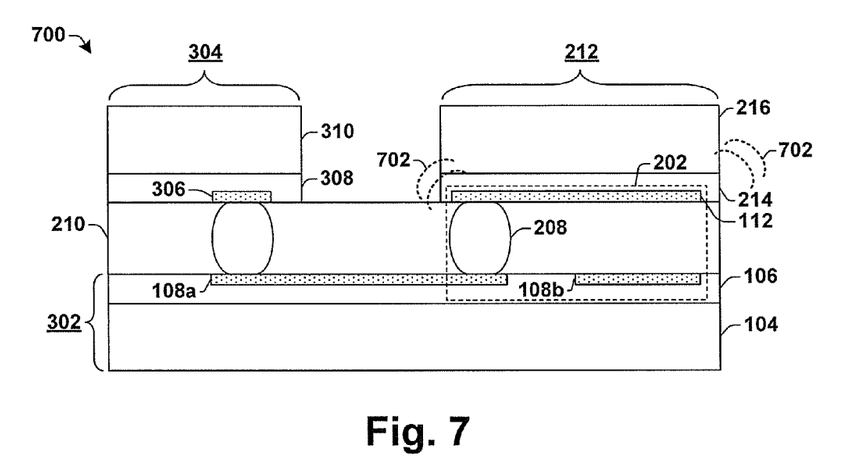
FIGS. 7-11 illustrate cross-sectional views of some additional embodiments of disclosed integrated antenna structures.

FIG. 7 shows a cross-sectional view of some alternative embodiments of a semiconductor module 700 comprising a disclosed integrated antenna structure 202.

The semiconductor module 700 comprises a 2.5D semiconductor module having a second, upper die 212 and a third die 304 stacked on a base die 302. In some embodiments, the second, upper die 212 comprises an antenna die having an upper metal layer 112 that forms an integrated antenna structure 202, and the third die 304 comprises a logic die having a signal generator configured to provide a signal that is transmitted by the integrated antenna structure 202.

The base die 302 has lower metal layers connected to one or more metal interconnect layers disposed within one or more dielectric layers 106. The lower metal layers comprise a first lower metal layer comprising a routing line 108a and a second lower metal layer, which is different than the first lower metal layer, comprising a ground plane 108b. The upper metal layer 112 of the second, upper die 212 extends to a position that is vertically above the ground plane 108b to form an integrated antenna structure 202. The routing line 108a is connected to the upper metal layer 112 by way of one or more micro-bumps 603, which act as feed points to provide a signal from a signal generator (e.g., third die 304) to the upper metal layer 112. During operation, the signal resonates between the upper metal layer 112 and the ground plane 108b. As the signal resonates, it forms a standing wave that leaks out from the ends of the antenna structure 202 and propagates as a wireless signal 702.

Figure 8:
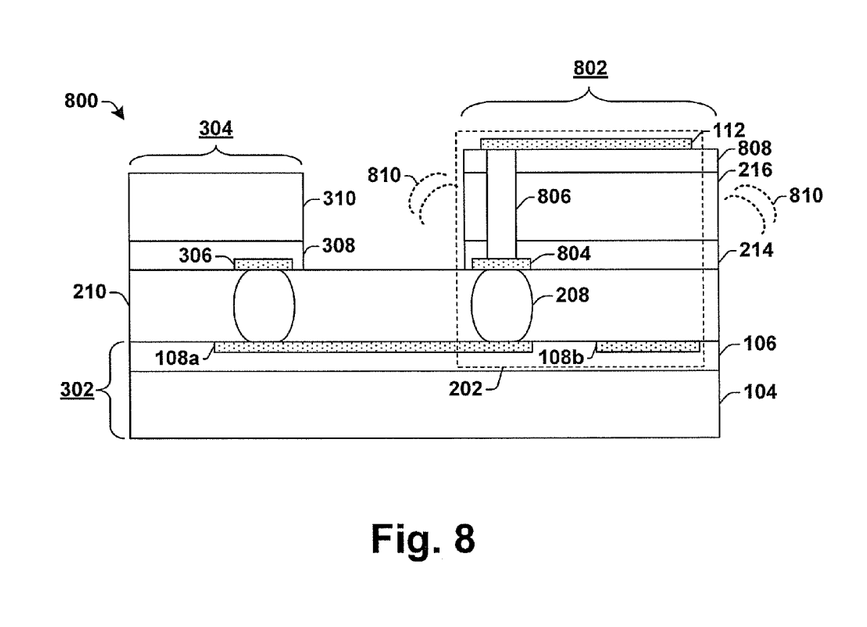

FIG. 8 shows a cross-sectional view of some alternative embodiments of a semiconductor module 800 comprising a disclosed integrated antenna structure 202.

The semiconductor module 800 comprises a 2.5D semiconductor module having a second, upper die 802 and a third die 304 stacked on a base die 302. In some embodiments, the second, upper die 802 comprises an antenna die having an upper metal layer 112 that forms an integrated antenna structure 202, and the third die 304 comprises a logic die having a signal source configured to provide a signal that is transmitted by the integrated antenna structure 202.

The second, upper die 802 comprises a second metal layer 804 located on a front-side of the second, upper die 802. The second metal layer 804 is connected to a routing line 108a in a first lower metal layer comprised within the base die 302. The routing line 108a is configured to provide a signal for transmission, by way of one or more micro-bumps, to the second metal layer 804. The second metal layer 804 is further connected to a through-silicon-via (TSV) 806 that extends through an interposer substrate 216 to the upper metal layer 112, which is located on a back-side of the second, upper die 802. In some embodiments, a dielectric layer 808 containing one or more metal interconnects is configured between the TSV 806 and the upper metal layer 112 to provide routing therebetween. The upper metal layer 112 extends to a position that is vertically above a ground plane 108b in a second lower metal layer to form an integrated antenna structure 202.

During operation, a signal is provided to the upper metal layer 112 at a feed point comprising TSV 806. The signal resonates between the upper metal layer 112 and the ground plane 108b. As the signal resonates, it forms a standing wave that leaks out from the ends of the antenna structure 202 and propagates as a wireless signal 810. By forming the integrated antenna structure 202 from the ground plane 108b on the base die 302 and the upper metal layer 112 on the back-side of the second, upper die 802 the distance between metal layers of the integrated antenna structure is increased and performance of the integrated antenna structure 202 is improved.

Figure 9:
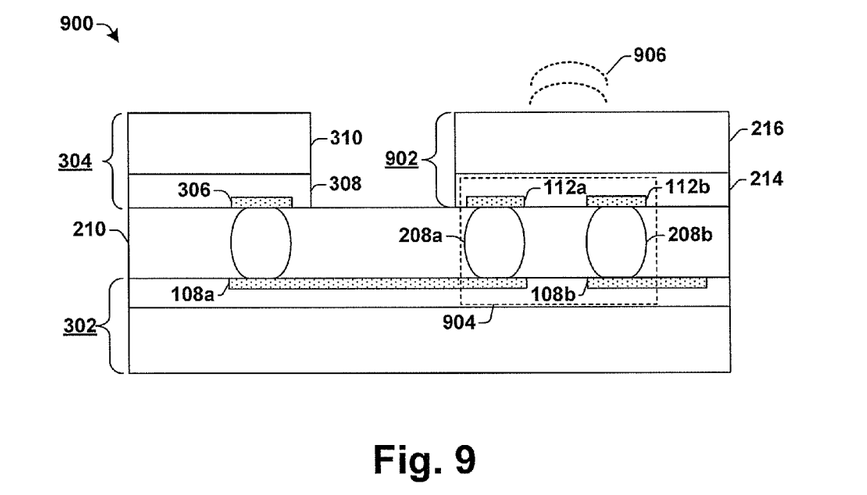

FIG. 9 shows a cross-sectional view of some alternative embodiments of a semiconductor module 900 comprising a disclosed integrated antenna structure 202. The semiconductor module 900 comprises a 2.5D semiconductor module having a second die 902 and a third die 304 stacked on a base die 302. In some embodiments, the second die 902 comprises an antenna die having an upper metal layer 112 that forms an integrated antenna structure 202, and the third die 304 comprises a logic die having a signal generator configured to provide a signal that is transmitted by the integrated antenna structure 202.

The base die 302 comprises a first lower metal layer comprising a routing line 108a and a second lower metal layer comprising a ground plane 108b. A first micro-bump 603a is disposed between the routing line 108a and a first structure on the upper metal layer 112a of the second die 902. A second micro-bump 603b is disposed between the ground plane 108b and a second structure on the upper metal layer 112a of the second die 902. By connecting the routing line 108a to the first structure on the upper metal layer 112a by way of a first micro-bump 603a and connecting the ground plane 108b to a second structure on the upper metal layer 112b by way of second micro-bump 603b, a horizontal integrated antenna structure 904 is formed that allows for signals to resonate in the lateral direction between a signal net (comprising 108a, 603a, and 112a) and a grounded net (comprising 108a, 603a, and 112a).

For example, during operation a signal is provided by way of the routing line 108a to the first micro-bump 603a and the first structure on the upper metal layer 112a. The signal resonates with grounded components 108b, 603b, and 112b. As the signal resonates, it leaks from the antenna structure 202 and propagates as a wireless signal 906 in a direction that is perpendicular to the lower and upper die, 302 and 902. In some embodiments, the second die 902 comprises a high resistance substrate that improves power radiation of the wireless signal 906.

It will be appreciated that the disclosed integrated antenna structure can be implemented in a variety of applications. For example, in various embodiments, the disclosed antenna structure can be used for transmission from die to die or die to PCB, or die to free space, to take place of either bond-wire, interconnects between die-to-die or die to PCB, or an antenna to free space itself.

Figure 10:
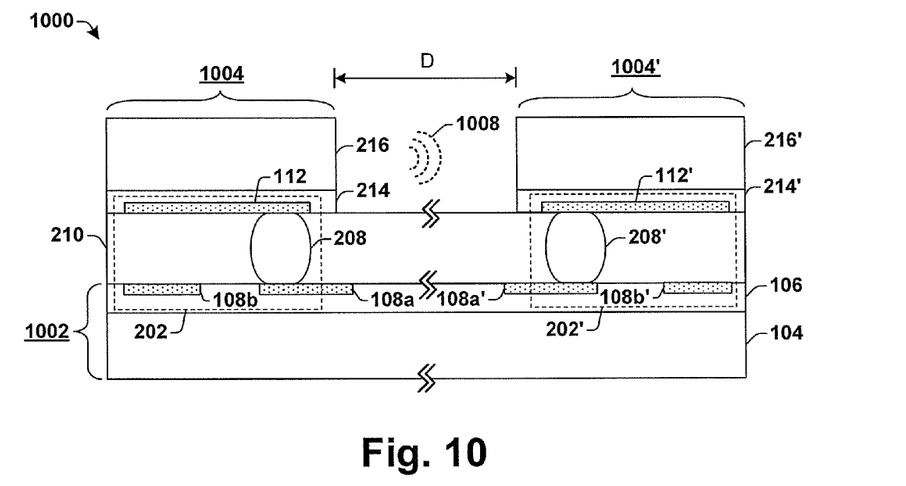

For example, FIG. 10 shows a cross-sectional view of some alternative embodiments of a 2.5D semiconductor module 1000 comprising a plurality of disclosed integrated antenna structures 202, 202' configured to provide for wireless connections between die connected to a common substrate (e.g., a BT package wafer).

In such embodiments, a first antenna die comprises an integrated antenna structure 202 having an upper metal layer 112 located on an upper die 1004 and a ground plane 108b located on a lower die 1002. The first antenna die is configured to transmit a wireless signal 1006, as described above. A second antenna die, separated from the first antenna die by a distance D (e.g., 1-2 mm), comprises a second integrated antenna structure 202' having a second upper metal layer 112' located on a second upper die 1004' and a second ground plane 108b' located on the lower die 1002. The second antenna die is configured to receive the transmitted wireless signal 1006. By transmitting and receiving wireless signals between the first and second antenna die metal interconnects extending between the first and second antenna die can be eliminated.

Figure 11:
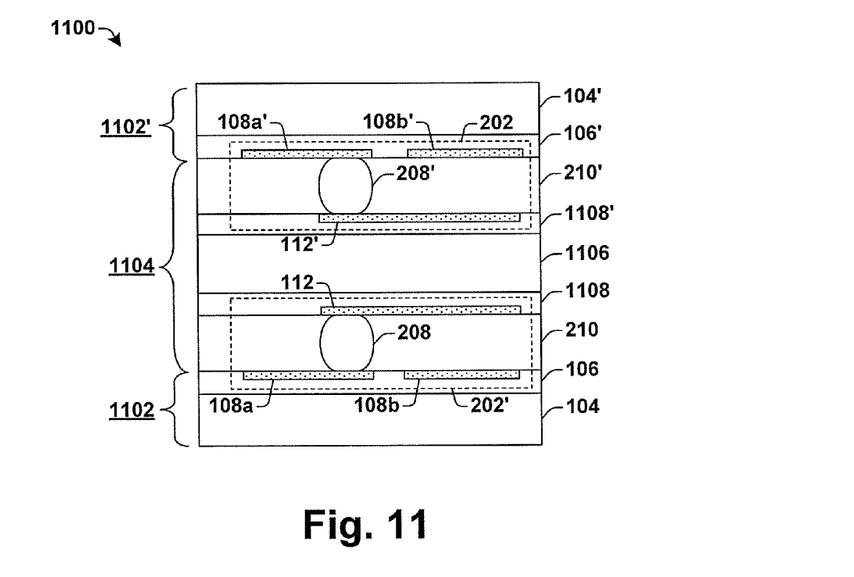

FIG. 11 shows a cross-sectional view of some alternative embodiments of a 3D semiconductor module 1100 comprising a plurality of disclosed integrated antenna structures 202, 202' configured to provide for wireless connections between die connected in a stacked structure.

In such embodiments, a first antenna die comprises an integrated antenna structure 202 having an upper metal layer 112 located on an interposer upper die 1104 and a ground plane 108b located on a lower die 1102. The integrated antenna structure 202 is configured to transmit a wireless signal, as described above. A second antenna die comprises a second integrated antenna structure 202' having a second upper metal layer 112' located on the upper die and a second ground plane 108b' located on a second lower die 1102'. The second integrated antenna structure 202' is configured to receive the transmitted wireless signal. The first and second antenna die are disposed on opposite sides of an interposer upper die 1104 having an interposer wafer 1106 and one or more dielectric layers 1108 and 1108'. By transmitting and receiving wireless signals between different die by way of the first and second antenna die through-silicon-vias extending between the first and second antenna die can be eliminated.

Figure 12:
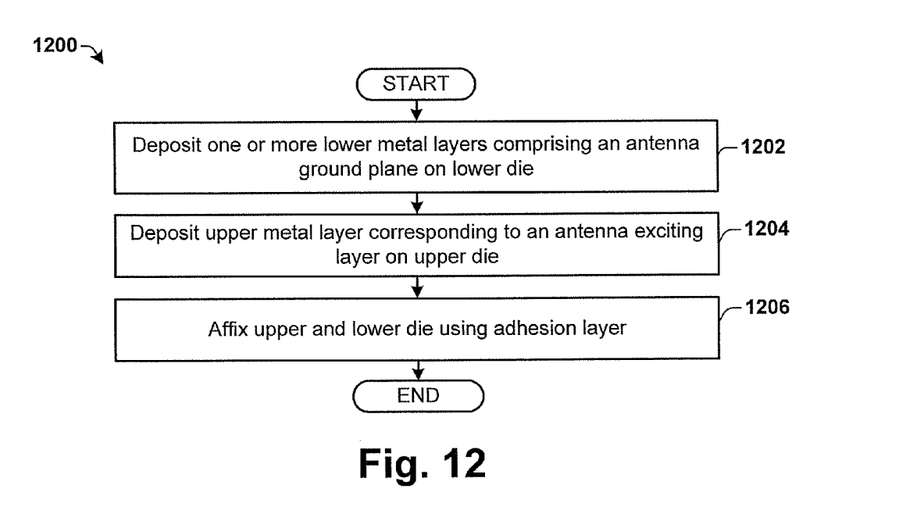
FIG. 12 is a flow diagram illustrating some embodiments of a method of forming a semiconductor module comprising a disclosed integrated antenna structure.

FIG. 12 is a flow diagram illustrating some embodiments of a method 1200 of forming a semiconductor module comprising a disclosed integrated antenna structure.

It will be appreciated that while the disclosed method 1200 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At step 1202, one or more lower metal layers are deposited on a lower die. The lower metal layers comprises a ground plane of an integrated antenna structure. In some embodiments, the lower metal layers further comprises a routing line configured to provide a signal to be transmitted for the integrated antenna structure. In such embodiments, the ground plane and the routing line are comprised within different lower metal layers. In some embodiments, the upper metal layer is formed by depositing a copper or aluminum metal onto a dielectric layer formed on the lower die by an evaporation or sputtering process. In some embodiments, at least one of the lower metal layers are formed on a top surface of the lower die, while in other embodiments at least one of the lower metal layers are formed within a dielectric material. In various embodiments, the lower die may comprise an integrated chip die or a packaging substrate.

At step 1204, an upper metal layer is deposited on an upper die. The upper metal layer corresponds an excited layer of the integrated antenna structure. In some embodiments, the upper metal is formed by depositing a metal material onto a dielectric layer formed on the upper die. In some embodiments, the upper metal layer is formed on a top surface of the upper die. In other embodiments, the upper metal layer is formed within a dielectric material that has an opening that allows the upper metal layer to be contacted. In yet embodiments, the upper metal layer is formed on a back-side of the upper die and is connected to a second metal layer formed on a front side of the upper die by way of a through-silicon-via. In some embodiments, the upper die comprises an interposer wafer. The interposer wafer may be a conventional interposer wafer or a high resistance interposer wafer.

At step 1206, the upper die is affixed to the lower die by way of an adhesion layer. In some embodiments, the adhesion layer comprises an underfill layer. In other embodiments, the adhesion layer comprises one or more micro-bumps. In some embodiments, the one or more micro-bumps are deposited on the top surfaces of the upper or/and lower die by an electroplating process. The top surfaces of the upper and lower die are then brought into contact and a heat (e.g., 200-400° C.) is applied to the contacting die to cause the micro-bumps to reflow and form a connection between the upper and lower die. In some embodiments, affixing the upper and lower die causes the one or more micro-bumps to provide an electrical connection between the upper metal of the upper die and the routing line, which is configured to provide the signal to be transmitted. By affixing the upper die to the lower die by one or more micro-bumps, the lower metal layer(s) and the upper metal layer are separated by a distance that is greater than or equal to a height of the one or more micro-bumps.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to a semiconductor module comprising an integrated antenna structure having upper and lower metal layers separated by a relatively large space that provides for good performance.

In some embodiments, the present disclosure relates to a semiconductor module comprising an integrated antenna structure configured to wirelessly transmit or receive electromagnetic radiation. The semiconductor module comprises a lower die having a lower metal layer comprising a ground plane connected to a ground terminal. The semiconductor module further comprises an upper die positioned vertically above the lower die and comprising an upper metal layer that extends to a position that is vertically above the ground plane, and which along with the lower metal layer operates as the integrated antenna structure. The semiconductor module further comprises an adhesion layer disposed between the lower die and the upper die and configured to physically connect the lower die to the upper die.

In another embodiment, the present disclosure relates to a semiconductor module comprising an integrated antenna structure configured to wirelessly transmit or receive electromagnetic radiation. The semiconductor module comprises a lower die, one or more lower dielectric layers disposed on the lower die, and a lower metal layer in contact with the one or more lower dielectric layers and comprising a ground plane connected to a ground terminal. The semiconductor module further comprises an upper die stacked on top of the lower die, one or more upper dielectric layers disposed on the upper die, and an upper metal layer in contact with the one or more upper dielectric layers and extending to a position that is vertically above the ground plane and which along with the lower metal layer operates as the integrated antenna structure. An adhesion layer is disposed between the upper die and the lower die and is configured to provide a physical connection between the upper die and the lower die. A signal generator is configured to provide a signal to the upper metal layer, wherein the signal excites the upper metal layer, causing the signal to resonate between the lower metal layer and the upper metal layer and to thereby generate a wireless signal.

In another embodiment, the present disclosure relates to a method of forming an integrated antenna structure. The method comprises depositing a lower metal layer on a lower die, wherein the lower metal layer comprises an antenna ground plane connected to a ground terminal. The method further comprises depositing an upper metal layer on an upper die, wherein the upper metal layer is connected to a signal generator configured to generate a signal to be transmitted. The method further comprises affixing the lower die to the upper die by way of an adhesion layer configured to provide a physical connection between the upper die and the lower die. Upon providing a signal to the upper metal layer, the signal excites the upper metal layer, causing the signal to resonate between the lower and upper metal layers and to propagate as a wireless signal.

What is claimed is:

1. A semiconductor module comprising an integrated antenna structure configured to transmit or receive a wireless signal, comprising:

a lower die comprising a semiconductor body and a lower metal layer comprising a ground plane connected to a ground terminal;

an upper die positioned vertically above the lower die and comprising an upper metal layer that extends to a position that is vertically above the ground plane, and which along with the lower metal layer operates as the integrated antenna structure; and an adhesion layer disposed between the lower die and the upper die and configured to physically connect the lower die to the upper die.

2. The semiconductor module of claim 1, wherein the adhesion layer comprises one or more micro-bumps disposed between the lower die and the upper die.

3. The semiconductor module of claim 2, wherein the lower die further comprises a second lower metal layer comprising:

a routing path connected between a signal generator located within the semiconductor module and the one or more micro-bumps, wherein the one or more micro-bumps provide for an electrical connection between the routing line and the upper metal layer that allows for the routing line to provide a signal from the signal generator to the upper metal layer, wherein the signal excites the upper metal layer, causing the signal to resonate between the lower and upper metal layers and to propagate a wireless signal.

4. The semiconductor module of claim 3,
   wherein the upper die comprises a high resistance interposer substrate having a resistance that is in a range of approximately 10 ohm-cm to approximately 1000 ohm-cm,
   wherein the high resistance interposer substrate is configured to improve radiation of the wireless signal.

5. The semiconductor module of claim 4, wherein the high resistance interposer comprises a glass interposer.

6. The semiconductor module of claim 2, wherein the upper die further comprising:

a through-silicon-via (TSV) extending through the interposer substrate and providing an electrical connection between the one or more micro-bumps and the upper metal layer, which comprises a metal layer positioned on a back-side of the upper die.

7. The semiconductor module of claim 3, further comprising:

an integrated chip die located on an opposite side of the lower die as the upper die and having a first metal layer connected to a second metal layer on a back-side of the lower die by way of a plurality of micro-bumps,
   wherein the lower die comprises a first interposer wafer having one or more through-silicon-vias extending through the first interposer wafer and configured to provide a connection between the second metal layer and the second lower metal layer.

8. The semiconductor module of claim 3, further comprising:

an integrated chip die located on a same side of the lower die as the upper die and having a first metal layer connected to the second lower metal layer of the lower die by way of a plurality of micro-bumps,
   wherein the lower die comprises a package wafer configured to provide an electrical connection between the integrated chip die and the upper die.

9. The semiconductor module of claim 1, wherein the adhesion layer comprises:

an underfill layer comprising a plurality of micro-bumps positioned between the upper die and the lower die.

10. The semiconductor module of claim 1, further comprising:
- a second integrated antenna structure comprising a second upper metal layer on the upper die and a second ground plane located on a second lower die; and
- an interposer substrate positioned between the integrated antenna structure and the second integrated antenna structure,
- wherein the integrated antenna structure and the second integrated antenna structure are configured to wirelessly transmit signals between the integrated antenna structure and the second integrated antenna structure.

11. The semiconductor module of claim 1, further comprising: a plurality of metal interconnect layers disposed within a dielectric layer at a position between the lower die and the lower metal layer.

12. A semiconductor module comprising an integrated antenna structure configured to wirelessly transmit or receive electromagnetic radiation, comprising:
- a lower die;
- one or more lower dielectric layers disposed on the lower die;
- a lower metal layer in contact with the one or more lower dielectric layers and comprising a ground plane connected to a ground terminal;
- an upper die stacked on top of the lower die;
- one or more upper dielectric layers disposed on the upper die;
- an upper metal layer in contact with the one or more upper dielectric layers and extending to a position that is vertically above the ground plane and which along with the lower metal layer operates as the integrated antenna structure; and
- an adhesion layer configured to provide a physical connection between the upper die and the lower die, wherein a first side of the adhesion layer abuts the lower metal layer and a second side of the adhesion layer, opposite the first side, abuts the upper metal layer.

13. The semiconductor module of claim 12,
- wherein the upper die comprises a high resistance interposer substrate having a resistance that is in a range of approximately 10 ohm-cm to approximately 1000 ohm-cm,
- wherein the high resistance interposer substrate is configured to improve radiation of the wireless signal.

14. The semiconductor module of claim 12, further comprising:
- an integrated chip die located on an opposite side of the lower die as the upper die and having a first metal layer connected to a second metal layer on a back-side of the lower die by way of a plurality of micro-bumps,
- wherein the lower die comprises a first interposer wafer having one or more through-silicon-vias extending through the first interposer wafer and configured to provide a connection between the second metal layer and the second lower metal layer.

15. The semiconductor module of claim 12, further comprising:
- an integrated chip die located on a same side of the lower die as the upper die and having a first metal layer connected to the second lower metal layer of the lower die by way of a plurality of micro-bumps,
- wherein the lower die comprises a package wafer configured to provide an electrical connection between the integrated chip die and the upper die.

16. The semiconductor module of claim 12, wherein the adhesion layer comprises one or more micro-bumps disposed between the lower die and the upper die.

17. A method of forming an integrated antenna structure, comprising:
- depositing a lower metal layer on a lower die comprising a semiconductor body, wherein the lower metal layer comprises an antenna ground plane connected to a ground terminal;
- depositing an upper metal layer on an upper die, wherein the upper metal layer is connected to a signal generator configured to generate a signal to be transmitted; and
- affixing the lower die to the upper die by way of an adhesion layer configured to provide a physical connection between the upper die and the lower die;
- wherein upon providing a signal to the upper metal layer, the signal excites the upper metal layer, causing the signal to resonate between the lower and upper metal layers and to propagate as a wireless signal.

18. The method of claim 17, wherein the adhesion layer comprises one or more micro-bumps abutting the lower metal layer and the upper metal layer, so that the lower metal layer and the upper metal layer are separated by a distance that is greater than or equal to a height of the one or more micro-bumps.

19. The method of claim 18,
- wherein the upper die comprises a high resistance interposer substrate having a resistance that is in a range of approximately 10 ohm-cm to approximately 1000 ohm-cm,
- wherein the high resistance interposer substrate is configured to improve radiation of the wireless signal.

20. The method of claim 17, wherein the upper metal layer is connected to a through-silicon-via extending through the upper die, such that the upper metal layer is disposed on a side of the upper die opposing the adhesion layer.

* * * * *